US009620242B1

(12) United States Patent
Roach et al.

(10) Patent No.: US 9,620,242 B1
(45) Date of Patent: Apr. 11, 2017

(54) METHODS AND APPARATUSES INCLUDING ONE OR MORE INTERRUPTED INTEGRATED CIRCUIT OPERATIONS FOR CHARACTERIZING RADIATION EFFECTS IN INTEGRATED CIRCUITS

(71) Applicant: The United States of America as represented by the Secretary of the Navy, Washington, DC (US)

(72) Inventors: Austin H. Roach, Bloomfield, IN (US); Matthew Gadlage, Bloomington, IN (US); Adam Duncan, Bloomington, IN (US); James David Ingalls, Bedford, IN (US); Matthew Kay, Jasper, IN (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 15/206,904

(22) Filed: Jul. 11, 2016

Related U.S. Application Data

(60) Provisional application No. 62/190,973, filed on Jul. 10, 2015.

(51) Int. Cl.
*G11C 16/16* (2006.01)
*G11C 16/14* (2006.01)
*G11C 29/12* (2006.01)

(52) U.S. Cl.
CPC .............. *G11C 29/12* (2013.01); *G11C 16/14* (2013.01)

(58) Field of Classification Search
USPC ............................... 365/185.22, 185.29, 201
See application file for complete search history.

(56) References Cited

U.S. PATENT DOCUMENTS

| 8,341,333 B2* | 12/2012 | Takada | G11C 7/1006 711/103 |
|---|---|---|---|
| 2008/0225598 A1* | 9/2008 | Jung | G11C 29/52 365/185.22 |
| 2012/0297271 A1 | 11/2012 | Sommer et al. | |
| 2014/0075208 A1 | 3/2014 | Herman et al. | |
| 2015/0169247 A1* | 6/2015 | Wang | G11C 16/22 711/103 |

* cited by examiner

Primary Examiner — Huan Hoang
Assistant Examiner — Minh Dinh
(74) Attorney, Agent, or Firm — Christopher A. Monsey

(57) ABSTRACT

Apparatuses and methods are provided using a plurality of interrupted IC operations to detect various conditions or changes of interest to integrated circuit (IC) elements (e.g., memory cells of NAND Flash memories or floating gate transistor) such as program/erase stress, total ionizing dose, and heavy ion exposure which modify normal IC element bit state changes. An exemplary method can include controlling a plurality of selected IC elements to execute a series of PROGRAM or ERASE operations on all of the plurality of selected elements that are each interrupted or halted before a normal or first time period required for the PROGRAM or ERASE operation has elapsed. An exemplary system records a number of interrupted operations required to cause a state change in each of the plurality of selected IC elements. Embodiments of the invention enable detection of stresses far below at least some thresholds for IC element or bit cell failure.

7 Claims, 17 Drawing Sheets

METHODS AND APPARATUSES INCLUDING ONE OR MORE INTERRUPTED INTEGRATED CIRCUIT OPERATIONS FOR CHARACTERIZING RADIATION EFFECTS IN INTEGRATED CIRCUITS

CROSS-REFERENCE TO RELATED APPLICATIONS

The present application claims priority to U.S. Provisional Patent Application Ser. No. 62/190,973, filed on Jul. 10, 2015, entitled "Interrupted PROGRAM and ERASE Operations for Characterizing Radiation Effects in Commercial NAND Flash Memories," the disclosure of which is expressly incorporated by reference herein.

STATEMENT REGARDING FEDERALLY SPONSORED RESEARCH OR DEVELOPMENT

The invention described herein was made in the performance of official duties by employees of the Department of the Navy and may be manufactured, used and licensed by or for the United States Government for any governmental purpose without payment of any royalties thereon. This invention (NC 200, 261) is assigned to the United States Government and is available for licensing for commercial purposes. Licensing and technical inquiries may be directed to the Technology Transfer Office, Naval Surface Warfare Center Crane, email: Cran_CTO@navy.mil.

BACKGROUND AND SUMMARY OF THE INVENTION

The present invention relates to testing of a plurality of integrated circuit (IC) elements. In particular, embodiments of the invention include methods and systems used to identify stresses or alterations in physical structure or function below IC element failure states, conditions, or points.

One type of IC includes NAND Flash which is a memory technology that is used in a wide variety of systems, including many systems with radiation hardness requirements. Characterization of radiation hardness of NAND Flash bit cells can include measurements of failure of the bit cells to retain data in various radiation environments. To better understand and predict the behavior of these devices, it would be useful to be able to measure changes in bit cell parameters caused by radiation exposure or other stresses below a threshold at which a bit cell failure occurs outside of a factory setting with specific knowledge of manufacturing test modes. Direct measurement of, for instance, bit cell threshold voltages without various types of such manufacturer information is not possible as manufacturers deliberately obscure these details in the construction of the digital interface to their devices. Careful characterization of parts then requires the measurement of large numbers of bits through the digital interface to obtain statistically significant results.

Despite limitations posed by manufacturers, some limited device specific success has been achieved in recovering details of analog characteristics of bit cells. However, such device specific approaches are not helpful given some devices do not implement features relied upon and, in many of the devices that do, necessary modifications to such device specific operation modes are undocumented thereby making interpretation of resulted challenging or impossible. Some types of modifications to original equipment manufacturer (OEM) IC operations have been attempted for purposes such as programming an IC to shield information for data security objectives. However, data or device security teams have a different focus and expertise mix than device characterization or fault analysis groups with different journals and publications that are generally not of interest of use to each other. Existing efforts with data security objectives would not function or be usable in device characterization for fault or condition detection purposes given a core operation of the data security action, e.g., issuing a reset command during a write operation, would not yield any useful information for device characterization. Even assuming a device characterization expert would show any interest in data security activities, a desire to engage in pure or basic research to determine of data security applications might have some application to device characterization would be required without any significant probability that results from one field might be improved or modified for use in another. Significant additional inventive effort would be required even assuming such an effort might actually produce a new method or apparatus. For example, additional operations would be needed beyond a data security operation along with creation of an analytical framework directed towards device characterization to detect specific conditions or changes in an IC under test which would require testing and validation to see if such a new approach would even work or produce useful information.

According to an illustrative embodiment of the present disclosure, apparatuses and methods are provided using a plurality of interrupted IC operations to detect various conditions or changes of interest to integrated circuit (IC) elements (e.g., memory cells of NAND Flash memories or floating gate transistor) such as program/erase stress, total ionizing dose, and heavy ion exposure which modify normal IC element bit state changes. An exemplary method can include controlling a plurality of selected IC elements to execute a series of PROGRAM or ERASE operations on all of the plurality of selected elements that are each interrupted or halted before a normal or first time period required for the PROGRAM or ERASE operation has elapsed. An exemplary system records a number of interrupted operations required to cause a state change in each of the plurality of selected IC elements. Embodiments of the invention enable detection of stresses far below the thresholds for IC element or bit cell failure.

Additional features and advantages of the present invention will become apparent to those skilled in the art upon consideration of the following detailed description of the illustrative embodiment exemplifying the best mode of carrying out the invention as presently perceived.

BRIEF DESCRIPTION OF THE DRAWINGS

The detailed description of the drawings particularly refers to the accompanying figures in which.

DETAILED DESCRIPTION OF THE DRAWINGS

The embodiments of the invention described herein are not intended to be exhaustive or to limit the invention to precise forms disclosed. Rather, the embodiments selected for description have been chosen to enable one skilled in the art to practice the invention.

Figure 1:
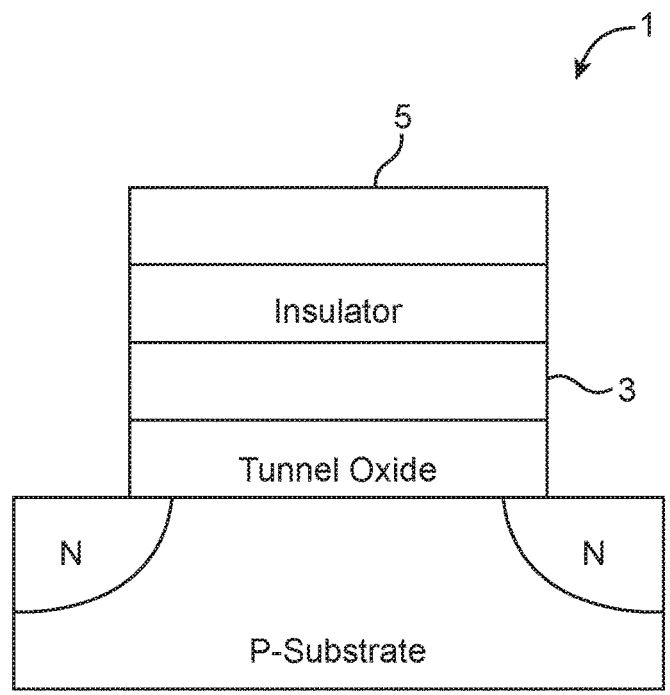
FIG. 1 shows one example of an exemplary IC element, e.g., a floating gate memory cell.

FIG. 1 shows one example of an exemplary IC element 1, e.g., a floating gate memory cell. A floating gate memory cell 1 can be defined as a modified field-effect transistor 1 that includes an electrically isolated floating gate (FG) 3. Information can be stored by adding or removing charge from the FG 3, which modifies the threshold voltage (VT) for the transistor 1. To program a NAND Flash memory cell 1, a large positive bias is applied to the control gate (CG) 5 relative to the transistor channel region, causing electrons to be transported through the tunnel oxide to the FG 3 via a Fowler-Nordheim tunneling process. To erase a memory cell 1, a large negative bias is applied to the CG 1 relative to the transistor channel region, causing electrons to be transported off of the FG 3 through the tunnel oxide via the same Fowler-Nordheim tunneling process. The state of the exemplary memory cell 1 can be read by applying a reference voltage (VREF) to the 5 that lies between the threshold voltages for the programmed and erased states. If the memory cell is 1 erased, with no electrons stored on the FG 3, the channel of the transistor 1 is turned on by the application of a voltage (e.g., VREF) to the CG 5, and the memory cell 1 is read as a logical '1'. If the memory cell 1 is programmed, with electrons stored on the FG 3, the channel of the transistor 1 is not turned on by the application of VREF to the CG 5, and the memory cell 1 is read as a logical '0'. NAND Flash memory devices can be composed of a large array of floating gate memory cells and the associated circuitry to modify and read the array. Address space of the NAND Flash memory array is organized into multiple blocks. Each block contains a number of pages, and each page contains a number of column addresses. A column address holds one byte of data. PROGRAM and READ operations typically operate on a single page, but an exemplary ERASE operation operates on an entire block.

NAND Flash memories can be designed with PROGRAM and ERASE operations may be interrupted by issuing a RESET command before their completion. Allowing their interruption makes it possible for a Flash memory controller to, for instance, read from the device quickly without waiting for an in-process ERASE operation to complete.

Figure 2:
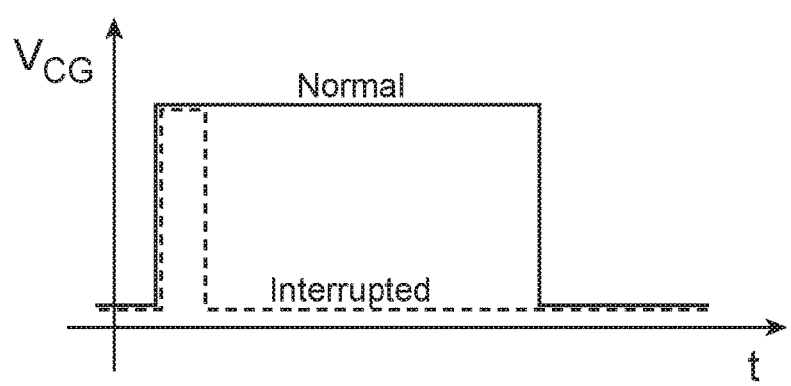
FIG. 2 shows an illustration of an effect of exemplary IC operations, e.g., RESET operation, on a control gate voltage during an interrupted PROGRAM operation.

FIG. 2 shows an illustration of an exemplary effect of the RESET on a control gate voltage during an interrupted PROGRAM operation. If the exemplary PROGRAM and ERASE operations are interrupted at a predefined moment, programming or erase voltage will have been held across the bit cell for an amount of time sufficient to cause some charge to be added or removed from the floating gate but insufficient to cause the bit cell to transition fully from the erased state to the programmed state or vice versa. The bit cell will then be partially programmed or partially erased. Datasheets for NAND Flash devices typically warn that addresses on which a PROGRAM or ERASE operation has been interrupted by a RESET command contain invalid data and must be fully erased before being reprogrammed thus teach away from such interrupted operations as an undesirable way to use such devices. However, embodiments of the invention can actually use the partial programming and erasing of memory cells to characterize memory cell threshold voltage distributions with some additional insights and process steps.

Figure 3:
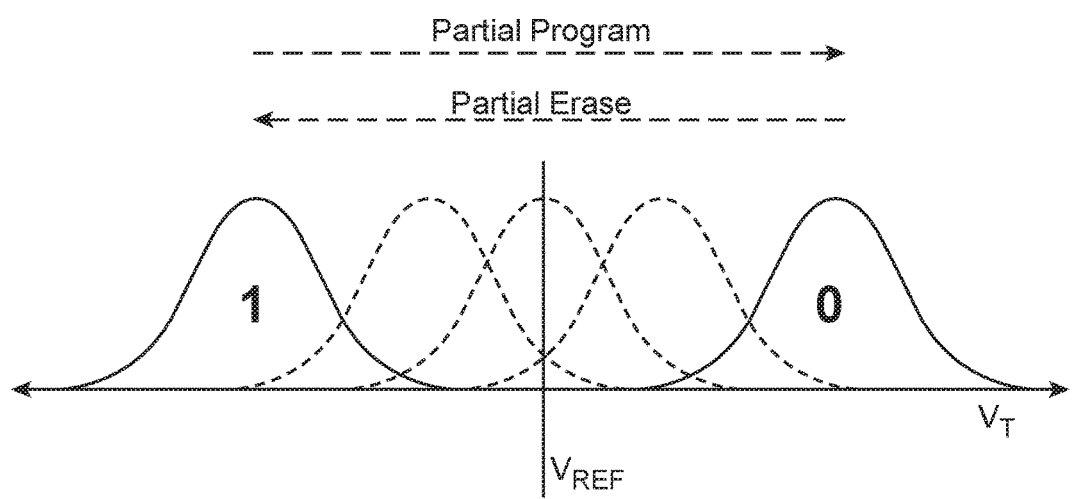
FIG. 3 shows an exemplary ensemble of bit cells having a distribution of threshold voltages that depends largely on programmed state of each exemplary memory cell but that also has some dependence on process variations, accumulated oxide stress, or other factors.

FIG. 3 shows an ensemble of bit cells having a distribution of threshold voltages that depends largely on programmed state of each memory cell but that also has some dependence on process variations, accumulated oxide stress, or other factors. When memory cells are programmed or erased in a single, complete operation, they are moved past VREF in one step from the '1' to '0' distribution or vice versa, giving no information about their relative positions within the threshold voltage distribution or about small changes to the mean of the distribution. By breaking down the operation into a number of partial program or partial erase steps, each bit cell can be characterized by the number of partial program or partial erase operations required for the threshold voltage of that bit cell to move past VREF. A number of partial program or partial erase operations can be incorporated into a testing process or system to provide a very sensitive measurement to characterize the memory cells.

Interrupted PROGRAM and ERASE commands can be implemented on an FPGA-based Flash memory tester created in accordance with various embodiments of the invention. Ideally, a tester could program any pattern of ones and zeros. However, in equipment that can be used with some embodiments have limitations on test pattern programming. For example, one exemplary tester can be operated to program NAND Flash pages using a number of pre-defined test patterns (solid '00's, 'AA's, '55's, etc.). After issuing a PROGRAM or ERASE command, a RESET command could be issued after waiting a user-configurable number of 5 MHz clock cycles, yielding a 200 ns time resolution. This exemplary Flash memory tester can be connected by an RS-232 serial interface to a computer that directed the tester to issue commands to the device under test (e.g., the NAND flash memory). The exemplary computer can be configured to specify interrupt timing for the PROGRAM and ERASE commands, and also processed and stored data read back from the device under test.

Timing for an exemplary RESET command relative to the PROGRAM and ERASE commands can be critical in some embodiments to produce a partial program or partial erase pulse that is long enough to move threshold voltages of device under bits past VREF in a finite number of operations, but short enough to not cause bits to move past VREF in a single operation. In some embodiments, an exemplary system moves threshold voltages of all device under test bits past VREF e.g., all bits on a page of memory. Optimal timing can vary between device models because of differences in internal logic that affects the delay between reception of a PROGRAM or ERASE command and the application of high voltage across the memory cells. Optimal timing in some embodiments varies a smaller amount from part to part and between blocks and pages on the same part.

Figure 4:
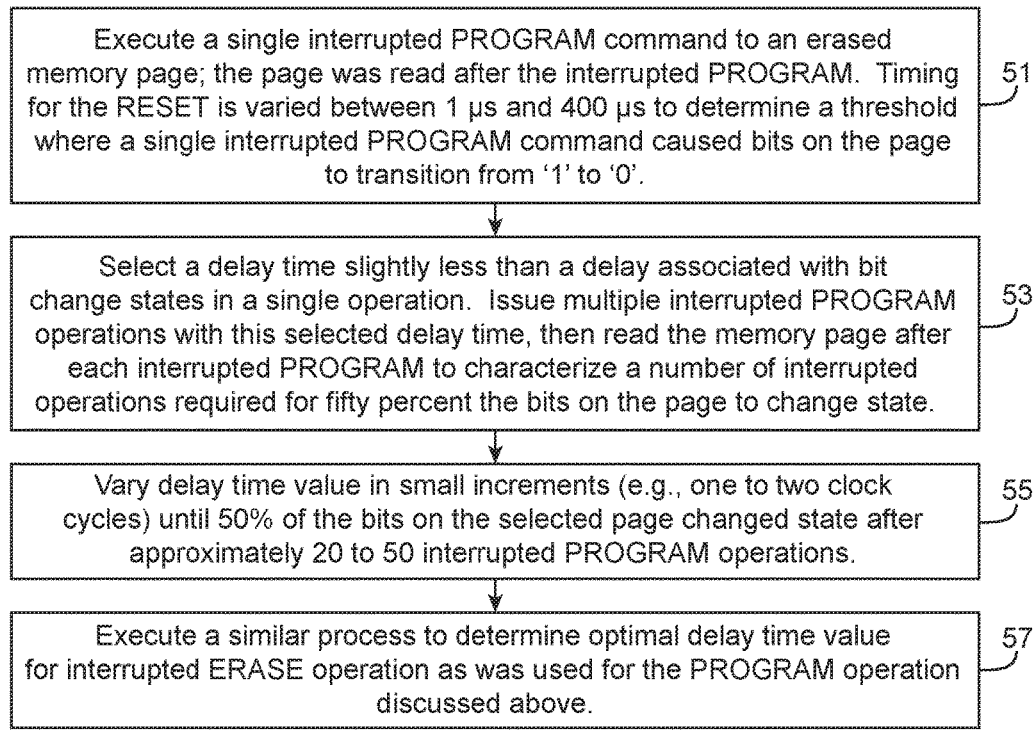
FIG. 4 shows an exemplary process that can be used to determine an exemplary optimal delay value for an interrupted PROGRAM operation and an ERASE operation.

Referring to FIG. 4, the following exemplary process can be used to determine an exemplary optimal delay value for an interrupted PROGRAM operation: Step 51) Execute a single interrupted PROGRAM command to an erased memory page; the page was read after the interrupted PROGRAM. Timing for the RESET is varied between 1 μs and 400 μs to determine a threshold where a single interrupted PROGRAM command caused bits on the page to transition from '1' to '0'. Step 53) Select a delay time slightly less than a delay associated with bit change states in a single operation. Issue multiple interrupted PROGRAM operations with this selected delay time, then read the memory page after each interrupted PROGRAM to characterize a number of interrupted operations required for fifty percent the bits on the page to change state. Step 55) Vary delay time value in small increments (e.g., one to two clock cycles) until 50% of the bits on the selected page changed state after approximately 20 to 50 interrupted PROGRAM operations. Step 57) Execute a similar process to determine optimal delay time value for interrupted ERASE operation as was used for the PROGRAM operation discussed above.

In various embodiments, a number of partial programs required to cause a bit to transition from a '1' to a '0' can be referred to as its 'partial program number'. A number of partial erases required to cause a bit to transition from a '0' to a '1' can also be referred to as its 'partial erase number'.

Figure 5:
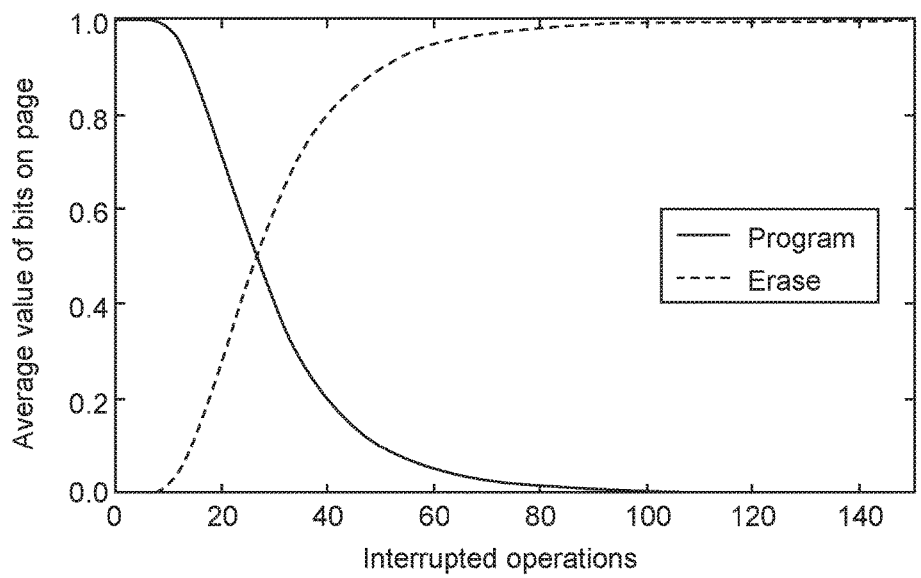
FIG. 5 shows results from an exemplary incremental programming and erasing of a page on a Samsung® K9K8G08U0D NAND flash memory.

FIG. 5 shows an exemplary incremental programming and erasing of a page on a Samsung® K9K8G08U0D NAND flash memory. For this exemplary partial program measurement, the page was first fully erased (logical '1's). The exemplary page was then programmed to all '0's with a series of partial programs with the RESET command issued 24.4 μs after issuing the PROGRAM command. After each partial program, the exemplary page was read to determine the fraction of bits that read as '1' and the fraction that read as '0'. The partial erase measurement was performed in nearly the same way, but with the page initially fully programmed to all '0's and with a delay of 194.8 μs before interruption of the ERASE operation. The memory cells on the measured page gradually transition between states as the partial operations are repeated.

Figure 6:
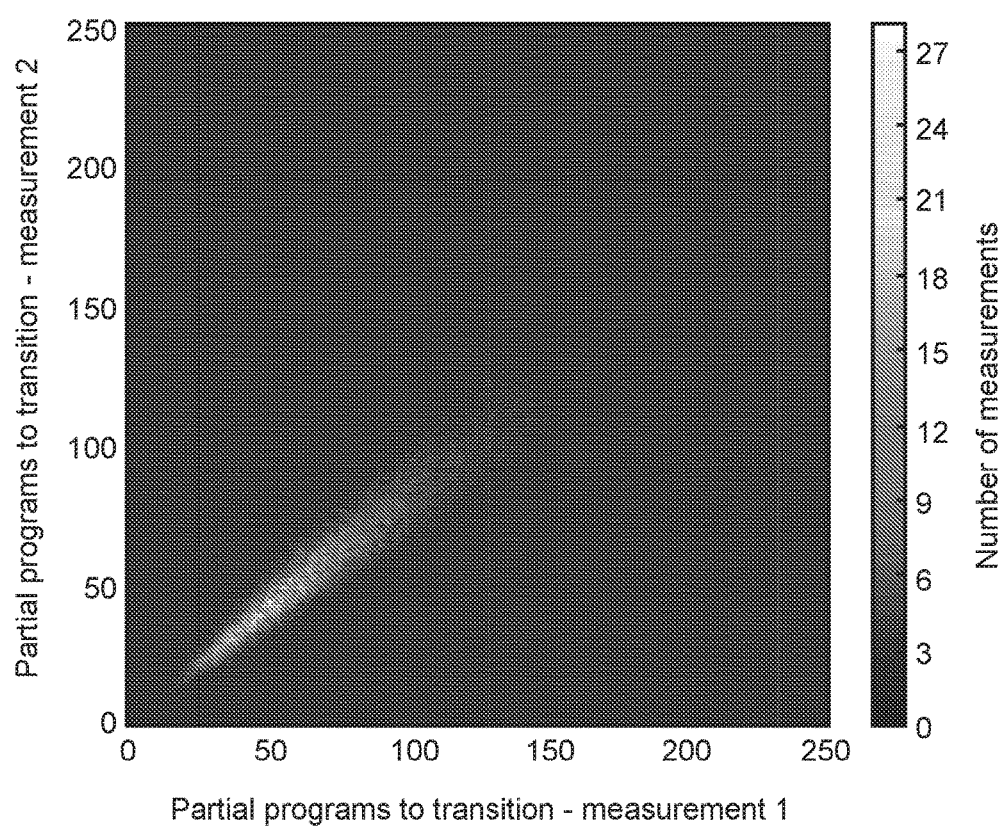
FIG. 6 shows how an exemplary partial program number for a given bit can be highly repeatable by one exemplary embodiment using repeated measurement of partial program numbers for all of bits on a single page.

Repeatability and Variability. FIG. 6 shows how an exemplary partial program number for a given bit can be highly repeatable by one exemplary embodiment using repeated measurement of partial program numbers for all of bits on a single page. In this example, the partial erase number for a bit is similarly repeatable. However, this exemplary partial program number and the partial erase number of a given bit are uncorrelated. The exemplary partial program numbers and the partial erase numbers for bits at the same column address on different pages are also uncorrelated, as are the partial program numbers and the partial erase numbers for bits at the same address but on different devices. Despite the large variability in the partial program numbers and partial erase numbers for bits in a page, large number of bits in a page can be used with embodiments of the invention to provide sufficient statistics to distinguish differences in the average population due to layout effects or stresses applied to the device.

Figure 7:
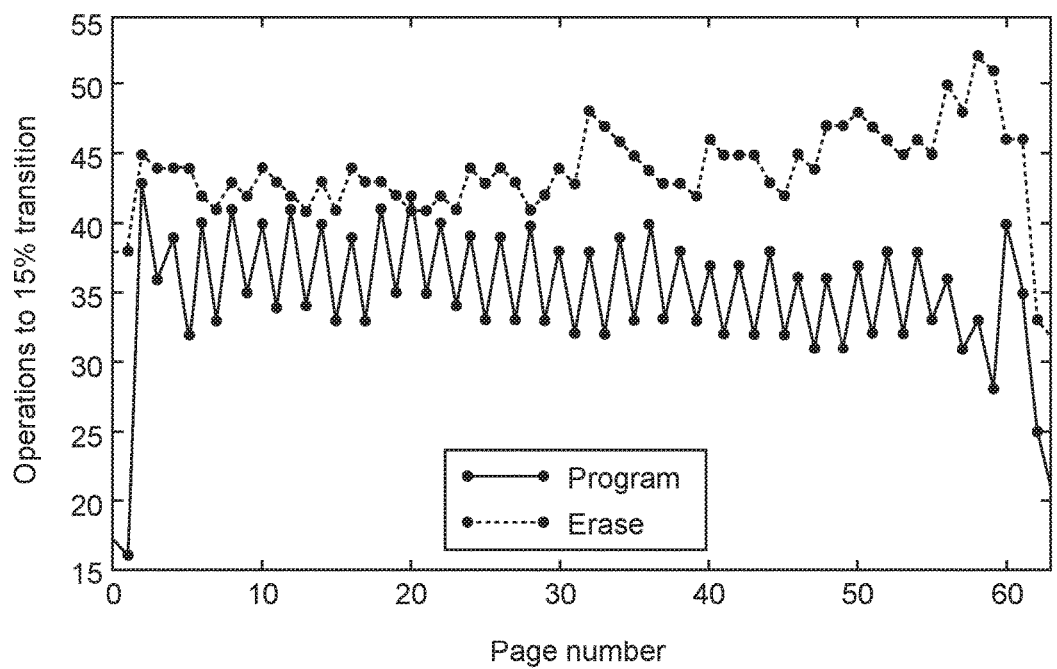
FIG. 7 shows an example of layout dependence where exemplary partial program and partial erase numbers are shown to be dependent on the page number within a block.

FIG. 7 shows an example of layout dependence where exemplary partial program and partial erase numbers are shown to be dependent on the page number within a block.

Characterizing Oxide Stress. Trapped charge in oxides in Flash memory cells can cause shifts in the cell threshold voltages. These shifts are apparent in the partial program or partial erase numbers for the memory cells. To demonstrate this, the partial program and partial erase numbers for the bit cells on two pages of a Samsung® K9K8G08U0D NAND flash memory device were initially characterized. One page was then subjected to program/erase (P/E) stress, in which the page was repeatedly fully programmed then fully erased, with measurements of the partial program and partial erase numbers made after 100 P/E cycles, 1000 P/E cycles, and 5000 P/E cycles. The other page was programmed to all '0's and then subjected to TID from a Co-60 source at a dose rate of 153 rad(Si)/s. The device was not powered during the irradiation, but the memory cells were biased by the charge on the floating gates. The partial program and partial erase numbers were measured after 50 krad(Si), 100 krad(Si), and 300 krad(Si) accumulated dose.

Figure 8:
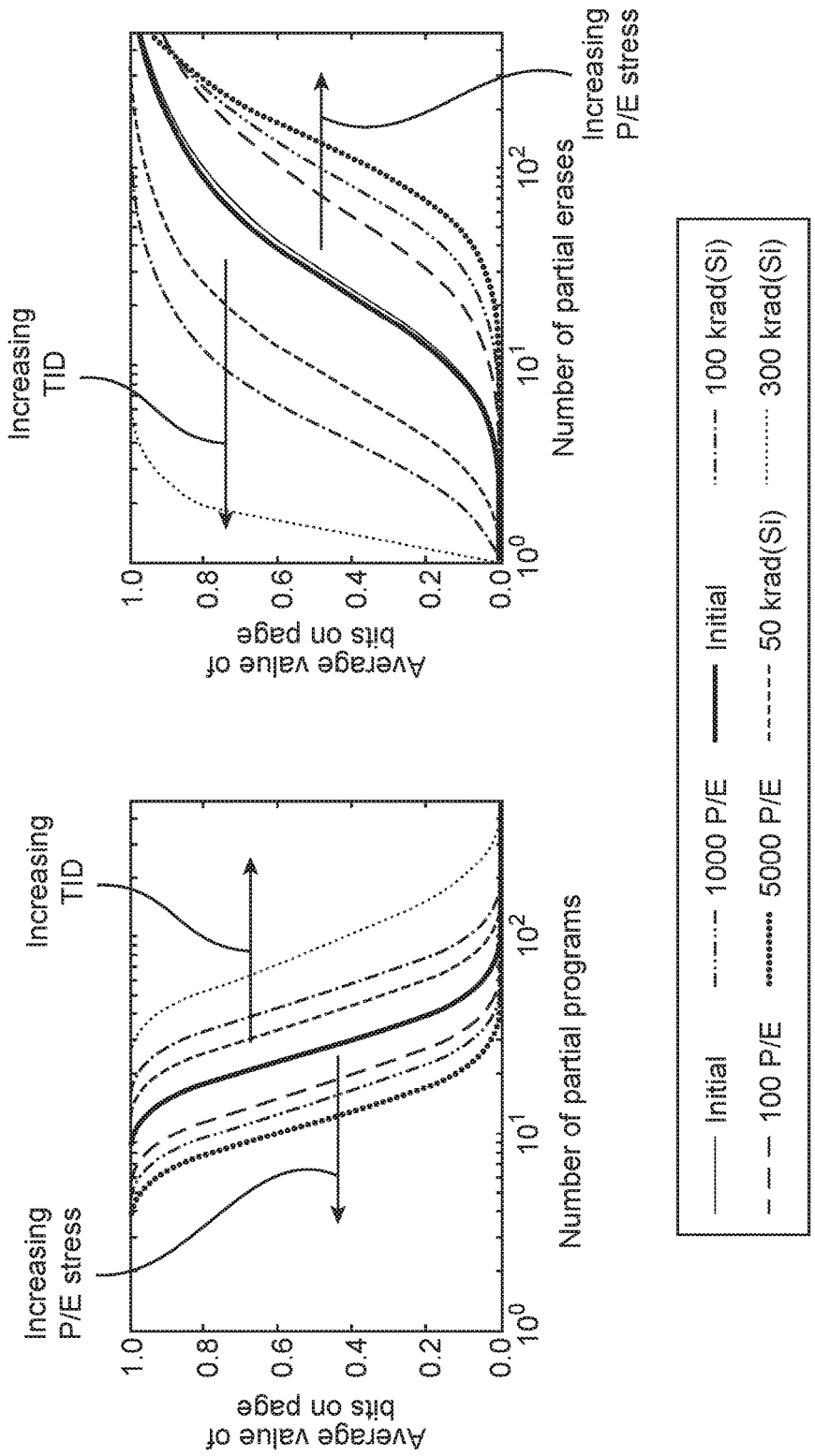
FIG. 8 shows an exemplary effect of stress on exemplary partial program and partial erase curves.

FIG. 8 shows an exemplary effect of stress on exemplary partial program and partial erase curves. The exemplary TID made the bit cells on the page more difficult to program and easier to erase, while the P/E stress made the bit cells on the page easier to program and more difficult to erase. These exemplary results are consistent with shifts in bit cell threshold voltages due to positive traps created in oxides by ionizing radiation exposure, and due to electrons trapped in the tunnel oxide after P/E cycling. In this embodiment, note that each of these exemplary effects can be apparent in a partial program and partial erase curves before they would have an effect on the normal operation of the device. These exemplary devices can have a specification of an endurance of $10^5$ program/erase cycles and errors in stored data due to TID not appearing until above 100 krad(Si) accumulated dose. The exemplary TID levels in FIG. 8 were selected to demonstrate gross changes to partial program and partial erase curves, but effects can be measurable at even lower doses.

Figure 9:
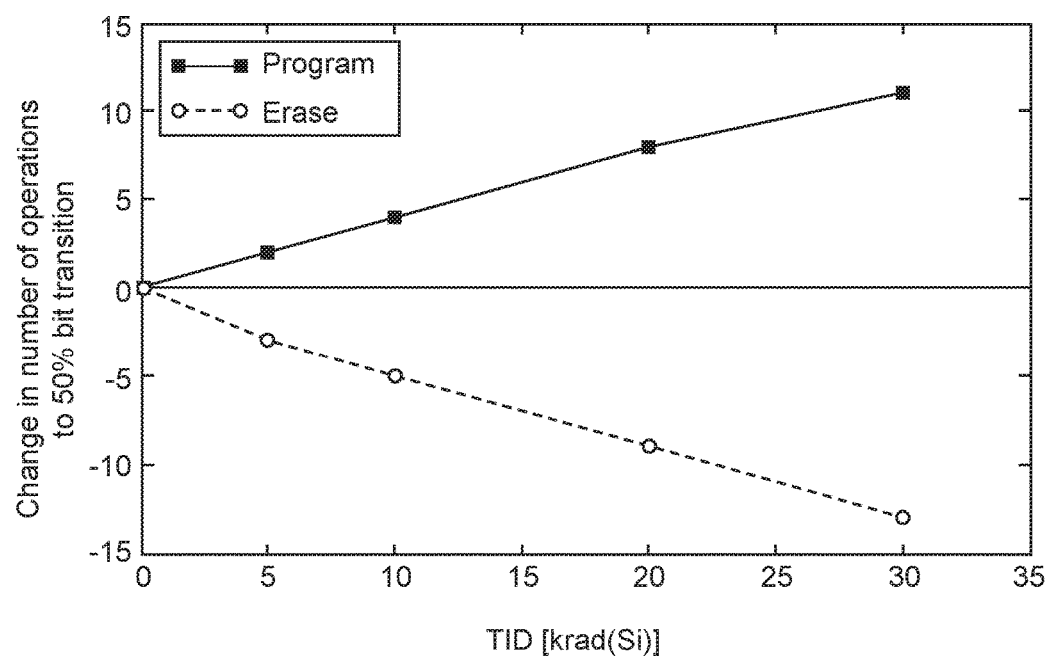
FIG. 9 shows exemplary changes in the partial program and partial erase curves from total ionizing dose (TID) in a range of 5-30 krad(Si)

FIG. 9 shows changes in the partial program and partial erase curves from TID in a range of 5-30 krad(Si). FIG. 9 shows numbers of partial programs and partial erases to cause 50% of the bits on a page to change value that was measured in an unirradiated state, and then after each TID exposure. Changes in the FIG. 9 values can be measurable even after exposure to doses that are only a few percent of a dose required to cause bit cell retention errors.

Measuring Damage from Heavy-Ion Irradiation. Previous discussions herein described changes in an average value of partial program numbers and partial erase numbers for a group of bits exposed to the same stress. Embodiments of the invention can demonstrate ability to measure properties of individual floating gate memory cells damaged by heavy ion irradiation as well.

A Samsung® K9F8G08U0M NAND flash memory was decapsulated and partial program and partial erase numbers were measured for all of the bits on a single page on 80 different blocks. The exemplary pages were then programmed to all '0's and the device was exposed unpowered to $1 \times 10^8$ ions/cm$^2$ of 15 MeV/amu Ta ions (LET=80 MeV-cm$^2$/mg). This exemplary application of heavy ion radiation resulted in damage to some bit cells that drastically reduced their data retention times. Partial program and partial erase numbers were measured again after irradiation.

Severely damaged bits were identified by erasing and reprogramming the 80 previously characterized pages to all '0's. The device was left at room temperature for 717 hours. The exemplary flash memory was read periodically during this time in order to observe the data loss. At the end of the test period, e.g., 717 hours, 250 bit cells across the evaluated pages read as erased.

Figure 10:
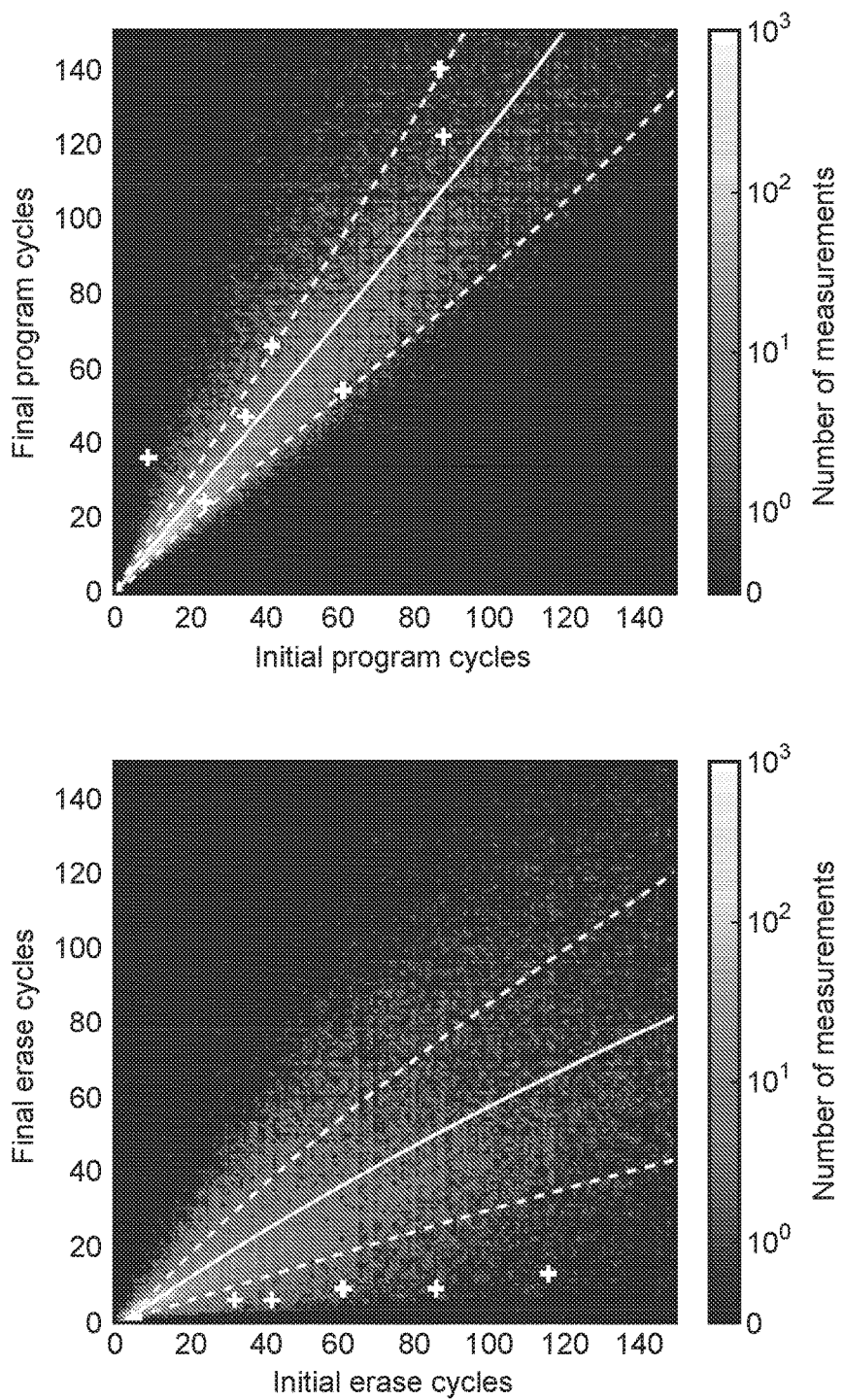
FIG. 10 shows exemplary two-dimensional histograms of pre-irradiation and post-irradiation partial program and partial erase numbers for Samsung® K9F8G08U0M NAND flash memory's bits on a single page.

FIG. 10 shows exemplary two-dimensional histograms of pre-irradiation and post-irradiation partial program and partial erase numbers for all of the Samsung® K9F8G08U0M NAND flash memory's bits on a single page. These exemplary values for the Samsung® K9F8G08U0M NAND flash memory's bits on that page that exhibited retention failures are indicated by the white crosses. Partial program numbers of each bit of the Samsung® K9F8G08U0M NAND flash memory that exhibited a retention failure were compared to all of the other bits on that bit's page using the following procedure:

Step 101) For each pre-irradiation partial program number, assemble the post-irradiation partial program numbers for all the bits on the page that shared that pre-irradiation partial program number. Step 103) Calculate a first mean and standard deviation of the post-irradiation partial program numbers for each pre-irradiation partial program number. Step 105) Calculating a second mean and standard deviations calculated for all of the pre-irradiation partial program numbers were fit to third-order polynomials using a least squares method 107) The post-irradiation partial program number for each bit that exhibited a retention failure was characterized by its distance from the mean in terms of the calculated standard deviation based on its pre-irradiation partial program number. A same or similar procedure was also followed to characterize the bits using these exemplary partial erase numbers. Lines in FIG. 10 show the fitted means and standard deviations for that page.

Figure 11:
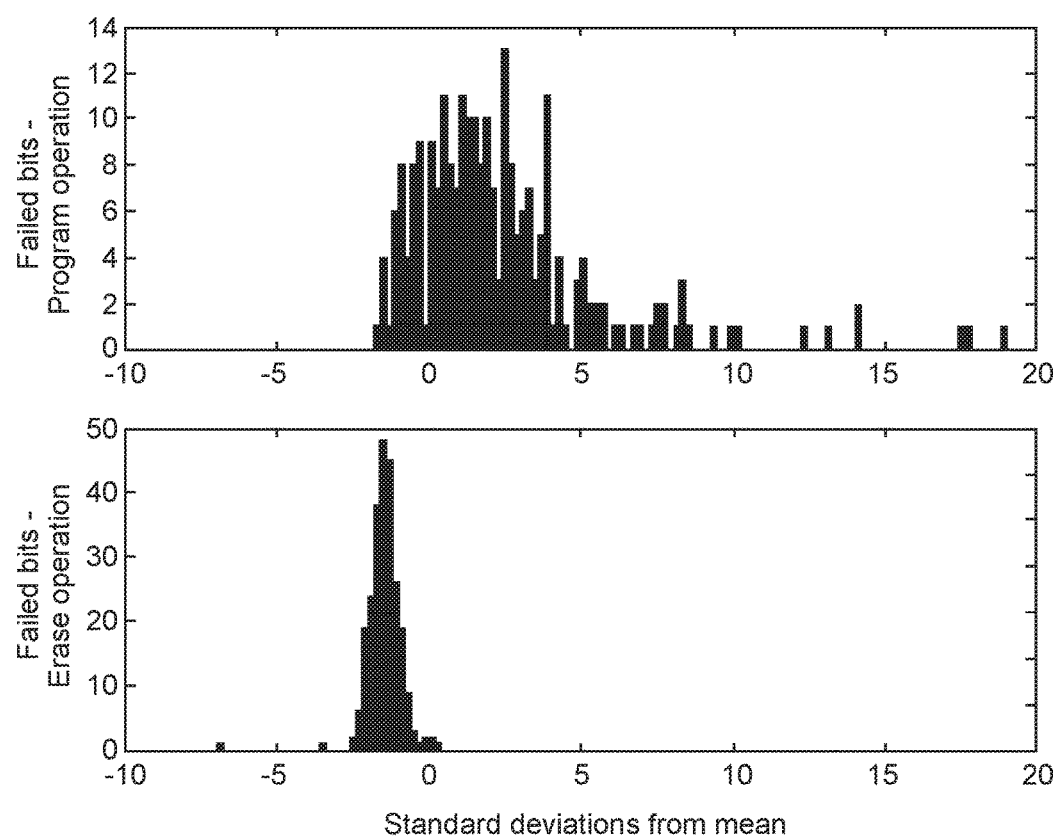
FIG. 11 shows exemplary histograms showing distance from the mean in units of standard deviations for exemplary partial program and partial erase measurements.

FIG. 11 shows exemplary histograms showing exemplary distance from the mean in units of standard deviations for exemplary partial program and partial erase measurements. All of the bits on the measured pages that exhibited retention failures are included in these exemplary histograms with the following exceptions: A) Six of the bits exhibiting retention failures are not represented in the partial program histogram because they failed to transition to the programmed state after the maximum number of, e.g., three hundred partial program measurements, so it was not possible to calculate their positions in terms of standard deviations. B) three of the bits exhibiting retention failures are not represented in the partial erase histogram because they either transitioned after a single operation during initial characterization or failed to transition to the erased state after the maximum number, e.g., three hundred partial erase cycles during the initial characterization, making it problematic to calculate their positions in terms of standard deviations.

Figure 12:
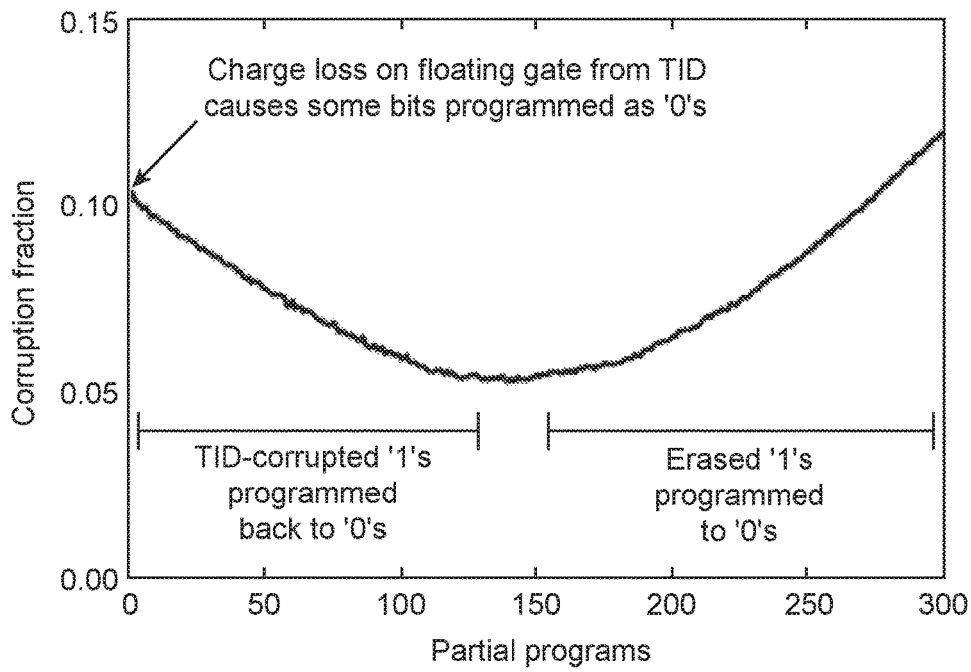
FIG. 12 shows results of an exemplary procedure for repairing or recovering stored data arising from TID-induced data corruption using a Samsung® K9K8G08U0D NAND flash memory.

The FIG. 12 histograms show that bits that exhibited retention failures are biased in the direction of being harder to program and easier to erase. This exemplary distribution overlaps an exemplary mean for the partial program measurement. For partial erase measurement, the exemplary distribution is separate from the exemplary mean, with a peak of the exemplary histogram lying at approximately 1.5 standard deviations from the exemplary mean. Positive traps created by this example of heavy ion irradiation may cause bit cell retention failures through a trap-assisted tunneling process. These exemplary traps could also cause changes to the exemplary partial program and partial erase numbers in two ways. Shifts in bit cell threshold voltages from the positive traps would make these exemplary bit cells easier to erase and harder to program. Also, a same increase in conductivity of tunnel oxide that creates retention errors could make it both easier to erase and easier to program. In the exemplary case of the exemplary partial erase, these two effects would work together to lower the partial erase number. In the exemplary case of the exemplary partial program, shifts to threshold voltage would act to increase the partial program number, while the increased tunnel oxide conductivity would act to decrease the partial program number. Competition between these two effects might explain why this exemplary partial erase number is a more sensitive measurement for damaged bit cells than the exemplary partial program number.

Repairing TID-Induced Data Corruption. Previous discussions have demonstrated some exemplary methods and applications in which exemplary partial program and erase technique are sensitive to charge trapped in oxides in Flash memory cells. Various embodiments of the invention may also be used to characterize charge levels on an exemplary floating gate itself. Ionizing radiation is known to remove charge from the floating gates of flash memory bit cells. If enough charge is removed, a programmed bit cell can read as erased rather than programmed. When such a corrupted bit cell reads as erased, it may still have some residual charge remaining on its floating gate, just not enough charge to be correctly read. A difference in charge level between truly erased bit cells and those bit cells corrupted by TID may be distinguished by applying partial programming pulses to all of the bit cells in order to accumulate charge on all floating gates until the corrupted bit cells are again read correctly.

For example, one page on a Samsung® K9K8G08U0D NAND flash memory was initially programmed to a pattern of all 'AA's, yielding 50% '1's and 50% '0's. The device was then irradiated unpowered in a Co-60 gamma-ray source at a dose rate of 153 rad(Si)/s to a total dose of 190 krad(Si). The device was read to confirm corruption. At that dose, slightly more than 20% of the bits that had initially been programmed to '0' read as '1', yielding just over 10% corruption of the data on the device. This exemplary page was then partially programmed with a pattern of all '0's with a RESET delay of 23.2 µs. After each partial programming operation, the data from the page was read and compared to the original 'AA' pattern.

FIG. 12 shows results of an exemplary procedure for repairing or recovering stored data arising from TID-induced data corruption using the above referenced Samsung® K9K8G08U0D NAND flash memory. Initially, a corruption percentage is 10.3%. After multiple partial program operations, the corruption percentage falls as bit cells corrupted by TID accumulate enough charge to again read correctly as '0's, eventually reaching a minimum of 5.2% after about 140 program operations. As more partial program operations are applied, some truly erased bit cells gain enough charge to be read as '0's, and the corruption percentage again increases. This exemplary repair technique may be useful in combination with ECC when TID causes corruption that is just beyond the ECC recovery threshold. It should be noted that repaired bit cells are left with only marginally more charge than is required to be read as '0's, and would therefore be very easily corrupted again by ionizing radiation. The repaired or recovered data would need to be rewritten the repaired or recovered device to regain the threshold voltage margin of normally written data.

Measurements in Multi-Level Cell (MLC) Devices. Measurements presented herein thus far have been made entirely on single level cell (SLC) devices, in which the bit cells have only two charge states. On MLC devices, transistors can have four charge states in the case of two-bit/cell devices, or eight charge states in the case of three-bit/cell devices. MLC storage of bits in a same memory cell complicates measurements, as information from multiple pages is being written to the same bit cell, but useful information may still be obtained if the more complicated internal logic is taken into account.

For example, partial program measurements were made on a two-bit/cell Micron® 29F32G08CBACA MLC NAND flash memory. A datasheet for this exemplary Micron MLC devices specifies which pairs of pages of the MLC share memory cells. In this example, this Micron® datasheet designates a particular page, e.g. page 50, as a first page of one pair in the MLC that must be programmed together.

Figure 13:
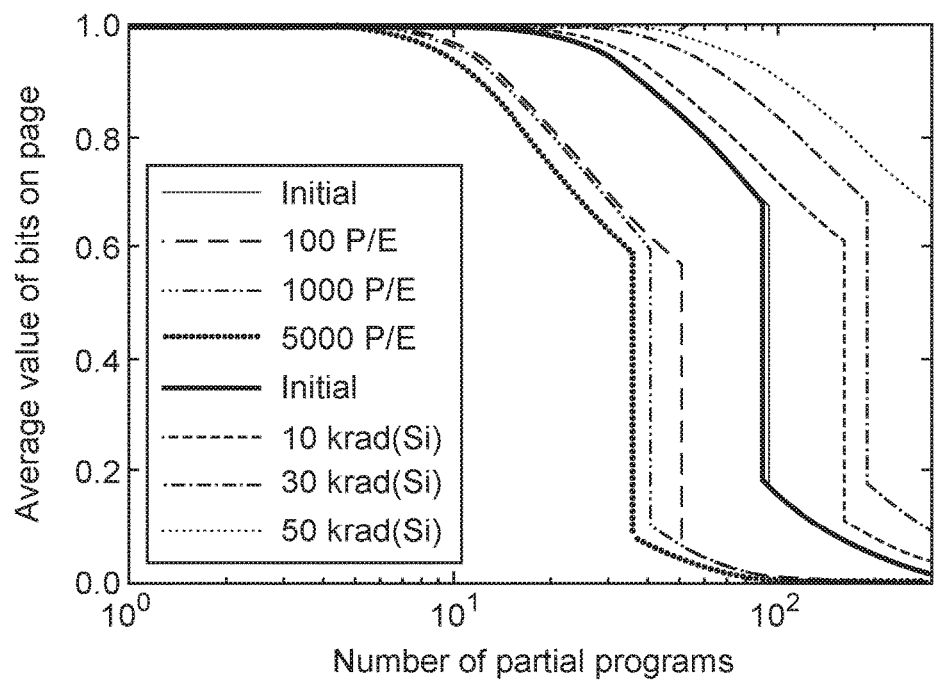
FIG. 13 shows resulting exemplary partial program curves for fresh memory device pages and for memory device pages exposed to P/E stress and TID based on an exemplary process.

FIG. 13 shows resulting exemplary partial program curves for fresh pages, and for pages exposed to P/E stress and TID based on the following exemplary process: step 201) erasing an initially selected block containing a number of pages including, e.g., page "50"; step 203) then selecting a first of a pair of related pages, e.g., page "50" then partially program the selected first of the pair of related pages (e.g., page "50") with a pattern of all '0's and a delay of 41 μs before issuing the RESET command, with a read after each partial program. The exemplary FIG. 13 partial program curves behave similarly to those for the SLC device, with the page becoming easier to program after P/E stress and harder to program after exposure to TID. One difference between exemplary SLC and exemplary MLC with an exemplary embodiment can include is the sudden change of 50% of the MLC's bits from the '1' to the '0' state after an exemplary single partial program operation. In this example, addresses that change in this single step form a pseudo-random pattern that repeats with a period of thirty-two column addresses, with the pattern changing after five hundred and twelve column addresses.

Designs of various ICs can and in fact did interfere with creating various aspects of the invention. For example, data-whitening algorithms can create a barrier to implementing aspects of various embodiments of the invention required for extracting useful or understandable data needed to perform required analysis. In one example, sudden transition of bit cells from one to a zero in an array of bit cells can result in forming repeating pseudo random sequences due to data-whitening functions built into a device under test. Such a data-whitening process would also explain an uncertainty of charge state levels encountered in previous radiation characterizations of a device under test. In this exemplary case, the exemplary device's normal operation would include writing solid '0's to a page would only transport electrons onto half of the floating gates. Initially in this example, the other 50% of the floating gates would be read as '1's, but after a sufficient number of partial program cycles, an internal state of this exemplary device would change to recognize the selected page as having been programmed; then an inverse of the exemplary data-whitening process would be applied by the device during a normal READ operation to report the uncharged memory cells as logical '0's. Experiment done in relation to creation of various embodiments of the invention demonstrates complications that can and do exist with measurements of advanced MLC devices. Completely understanding internal logic of these devices is not realistic without cooperation from a manufacturer absent costly and perhaps impossible to achieve reserve engineering.

But even without a complete understanding of internal aspects of a selected device, the exemplary interrupted PROGRAM and ERASE technique in accordance with various embodiments of the invention may be used to characterize changes in the memory cells of these MLC devices.

Figure 14A:
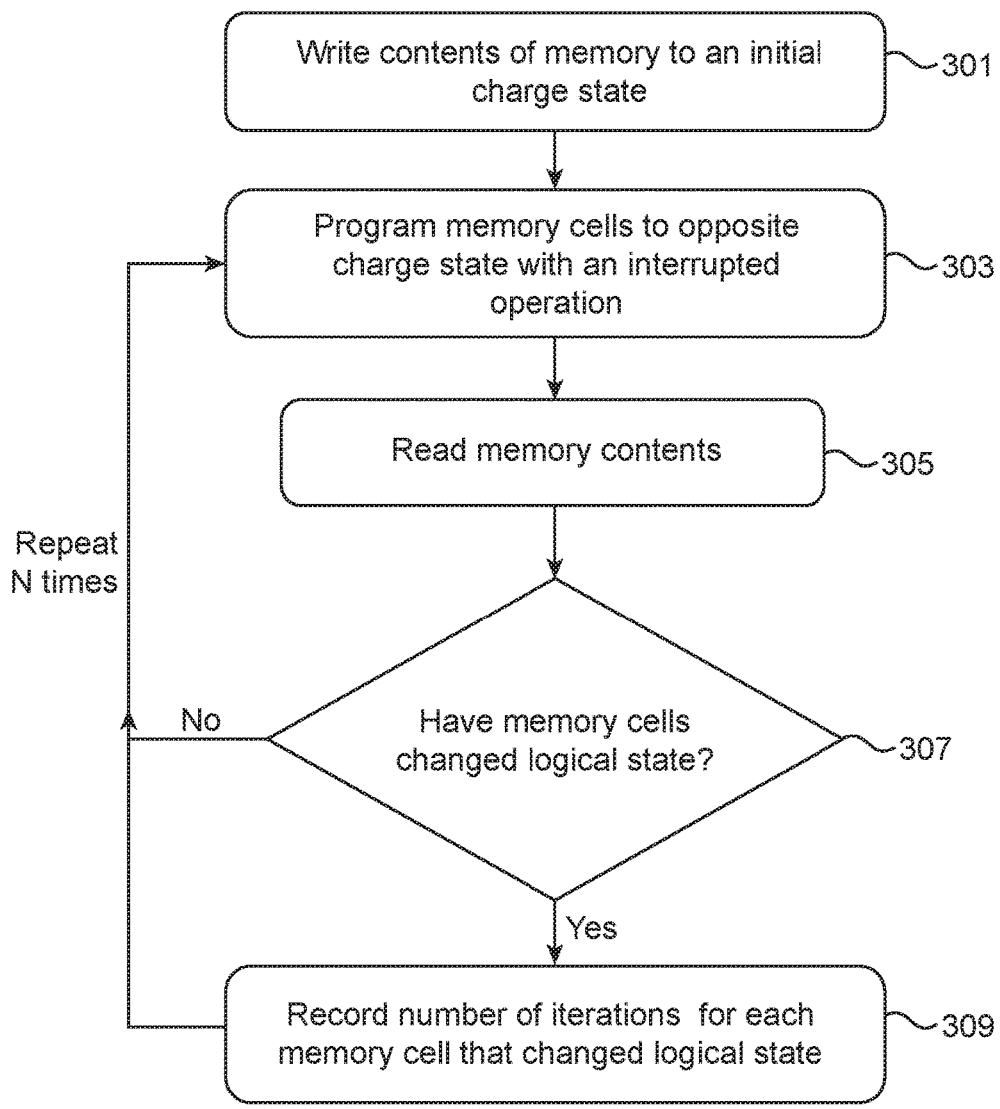
FIGS. 14A and 14B show an exemplary process for characterizing memory cells.
Figure 14B:
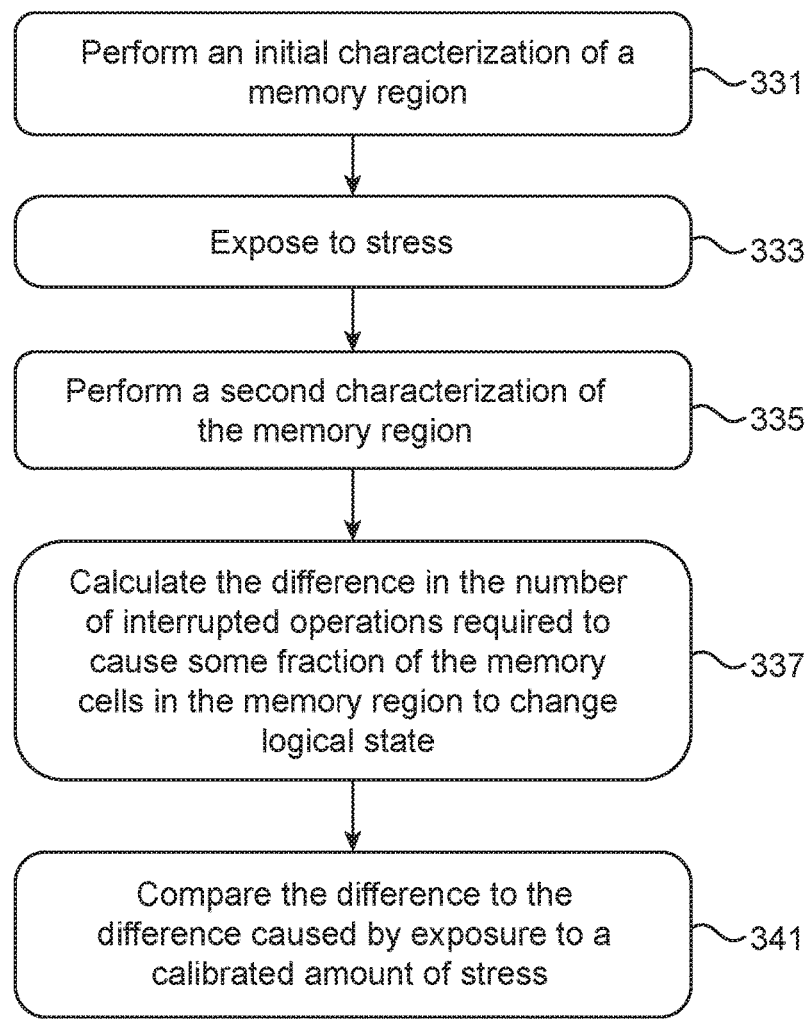

Referring to FIG. 14, an exemplary process for characterizing memory cells is provided. At step 301, write contents of memory to an initial charge state. At step 303, program memory cells to opposite charge state with an interrupted operation. At step 305, read memory contents. At step 307, determine if the memory cells have changed their logical state—if yes, at step 309 record number of iterations for each memory cell that changed logical state then return to step 303 and to repeat processing N time; if no, then return to step 303 to repeat processing N times. Terminate after N times.

Figure 15:
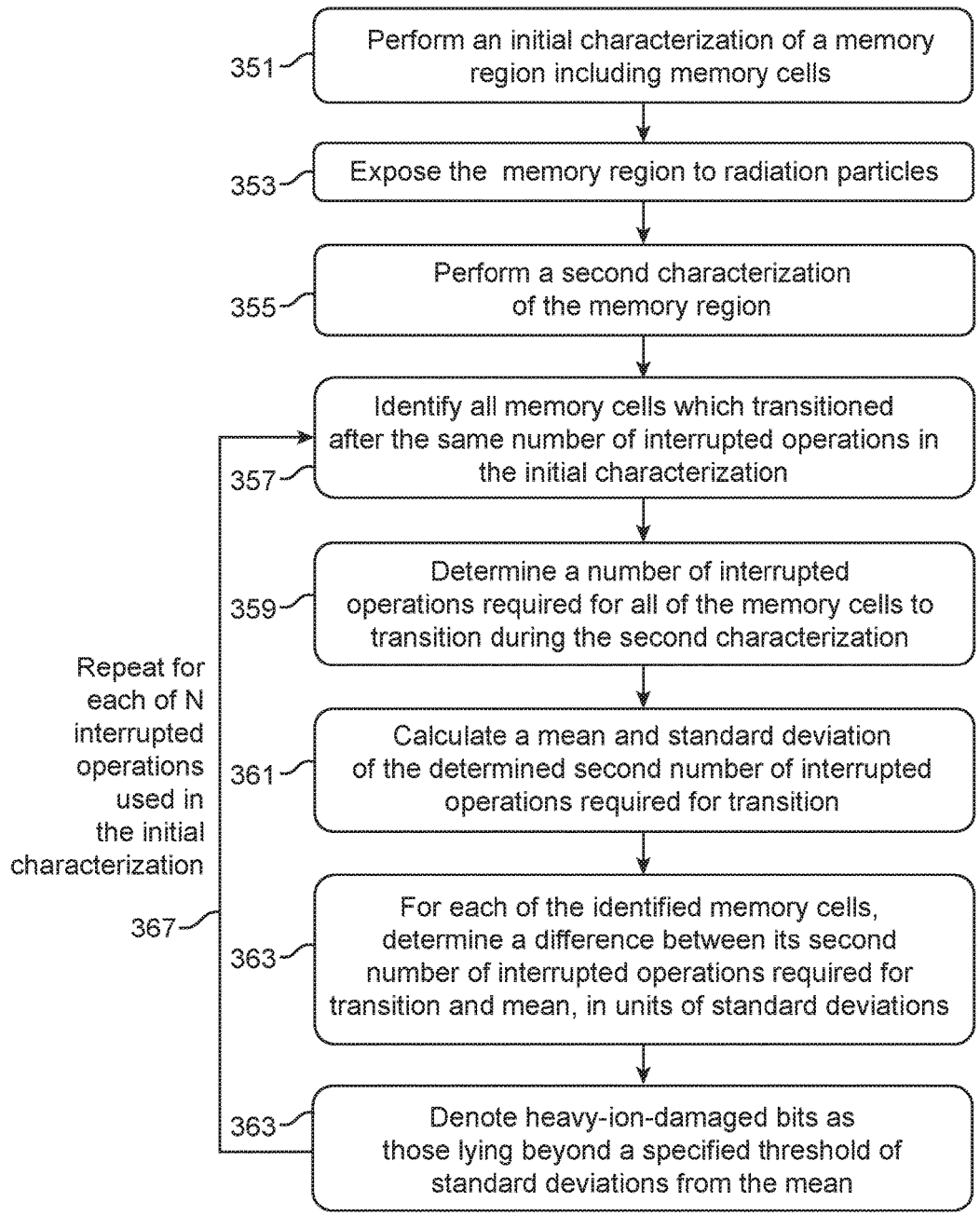
FIG. 15 shows an exemplary process for detection of memory cells damaged by a single particle.

Referring to FIG. 15, an exemplary process for detection of memory cells damaged by a single particle is provided. At step 351, perform an initial characterization of a memory region including memory cells such as, e.g., as discussed herein. At step 353, expose the memory region to radiation particles. At step 355, perform a second characterization of the memory region such as, e.g., discussed herein. At step 357, identify all memory cells which transitioned logic states after the same number of interrupted operations in the initial characterization. At step 359, assemble or determine a number of interrupted operations required for all of the memory cells to transition logic states during the second characterization. At step 361, calculate a mean and standard deviation of the second number of interrupted operations required for transition of logic states. At step 363, for each assembled memory cells, determine a difference between its second number of interrupted operations required for transition and mean, in units of standard deviations. At step 365, identify heavy ion damaged bits in the memory region its cells as those lying beyond a specified threshold of standard deviations from the mean then return to step 357 and repeat processing for each of N interrupted operations used in the initial characterization. The above process can be executed using a signal measurement system such as, e.g. voltage detection system via probe pads or incorporated into a testing system which can read the cells or memory region through a memory device's bus circuitry or systems.

Figure 16:
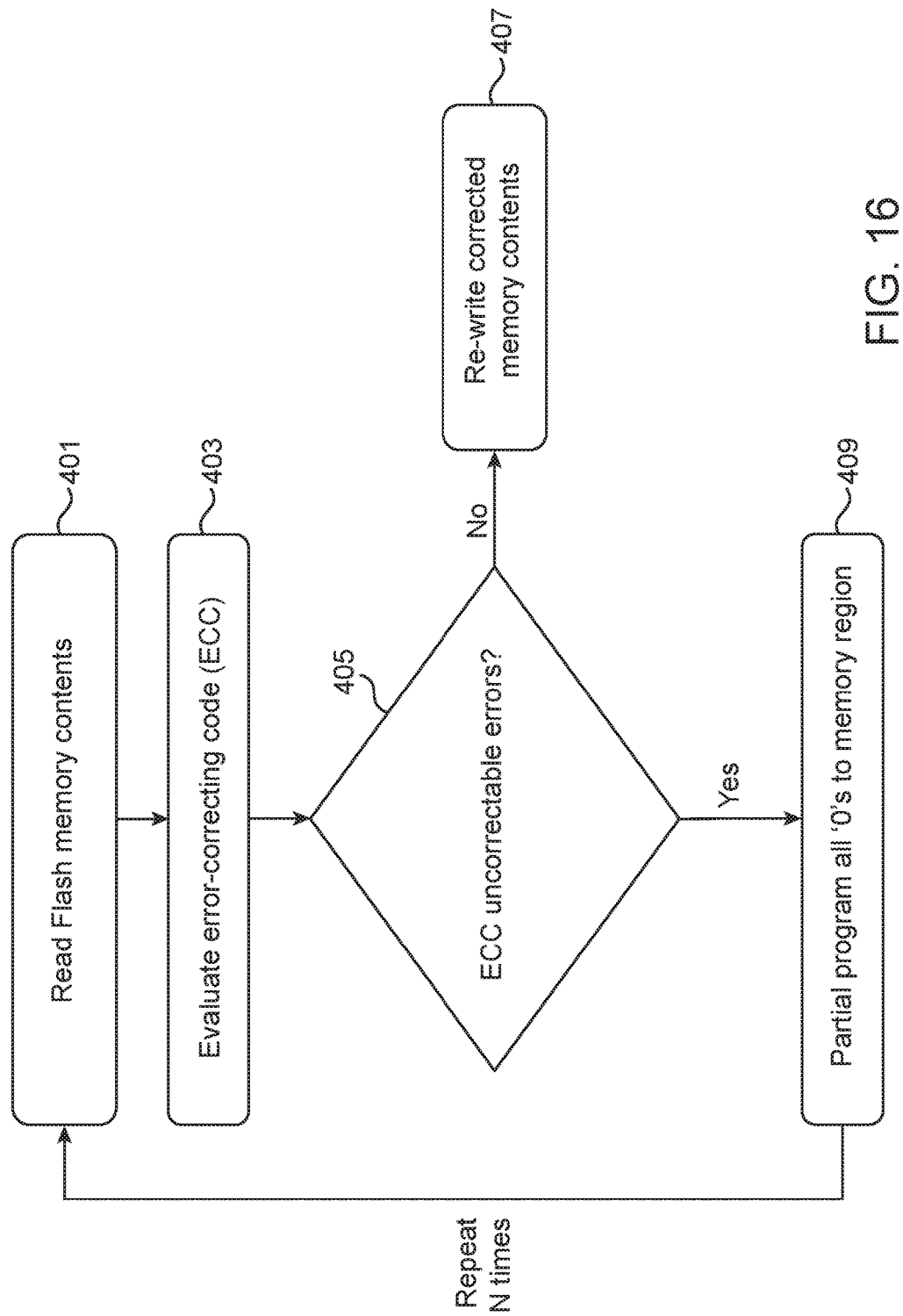
FIG. 16 shows an exemplary machine implemented process for performing correction of TID-induced data corruption.

Referring to FIG. 16, an exemplary machine implemented process for performing correction of TID-induced data corruption. At step 401, read Flash memory contents. At step 403, read and evaluate error-correcting code (ECC). At step 405, determine if ECC indicates correctable errors from step 403; if no, re-write corrected memory contents at step 407 and terminate; if yes, then proceed to step 409 and partial program all "0"s to the memory region from the Flash memory contents with errors then repeat N times resuming processing at step 401.

Figure 17:
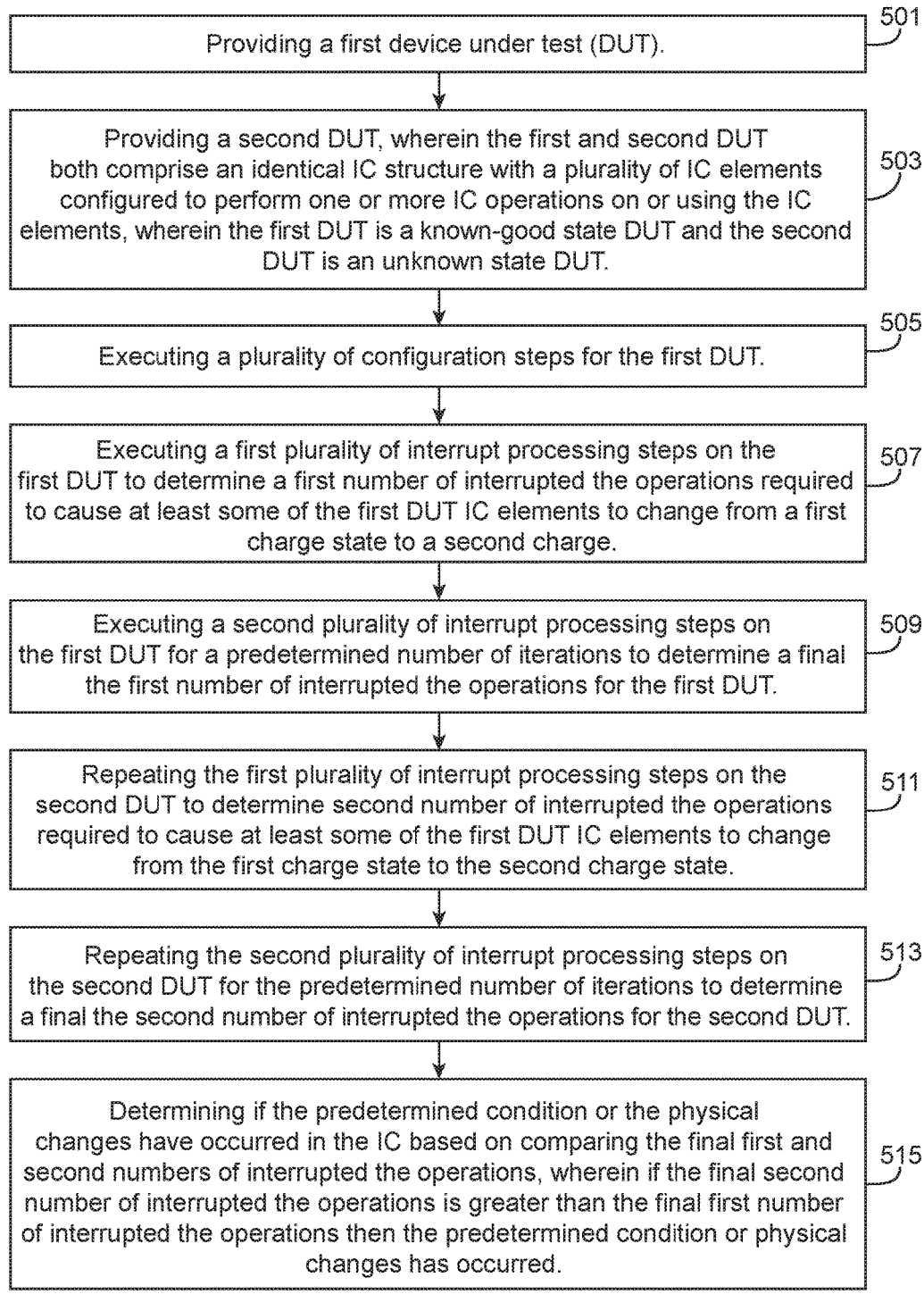
FIG. 17 shows an exemplary machine implemented process for characterizing or detecting a predetermined condition or physical changes in an exemplary IC.

Referring to FIG. 17, an exemplary machine implemented process for characterizing or detecting a predetermined condition or physical changes in an exemplary IC is provided. At step 501, providing a first device under test (DUT). At step 503, providing a second DUT, wherein the first and second DUT both comprise an identical IC structure with a plurality of IC elements configured to perform one or more IC operations on or using the IC elements, wherein the first DUT is a known-good state DUT and the second DUT is an unknown state DUT. At step 505, executing a plurality of configuration steps for the first DUT. At step 507, executing a first plurality of interrupt processing steps on the first DUT to determine a first number of interrupted the operations required to cause at least some of the first DUT IC elements to change from a first charge state to a second charge. At step 509, executing a second plurality of interrupt processing steps on the first DUT for a predetermined number of iterations to determine a final the first number of interrupted the operations for the first DUT. At step 511, repeating the first plurality of interrupt processing steps on the second DUT to determine second number of interrupted the operations required to cause at least some of the first DUT IC elements to change from the first charge state to the second charge state. At step 513, repeating the second plurality of interrupt processing steps on the second DUT for the predetermined number of iterations to determine a final the second number of interrupted the operations for the second DUT. At step 515, determining if the predetermined condition or the physical changes have occurred in the IC based on comparing the final first and second numbers of interrupted the operations, wherein if the final second number of interrupted the operations is greater than the final first number of interrupted the operations then the predetermined condition or physical changes has occurred.

Figure 18:
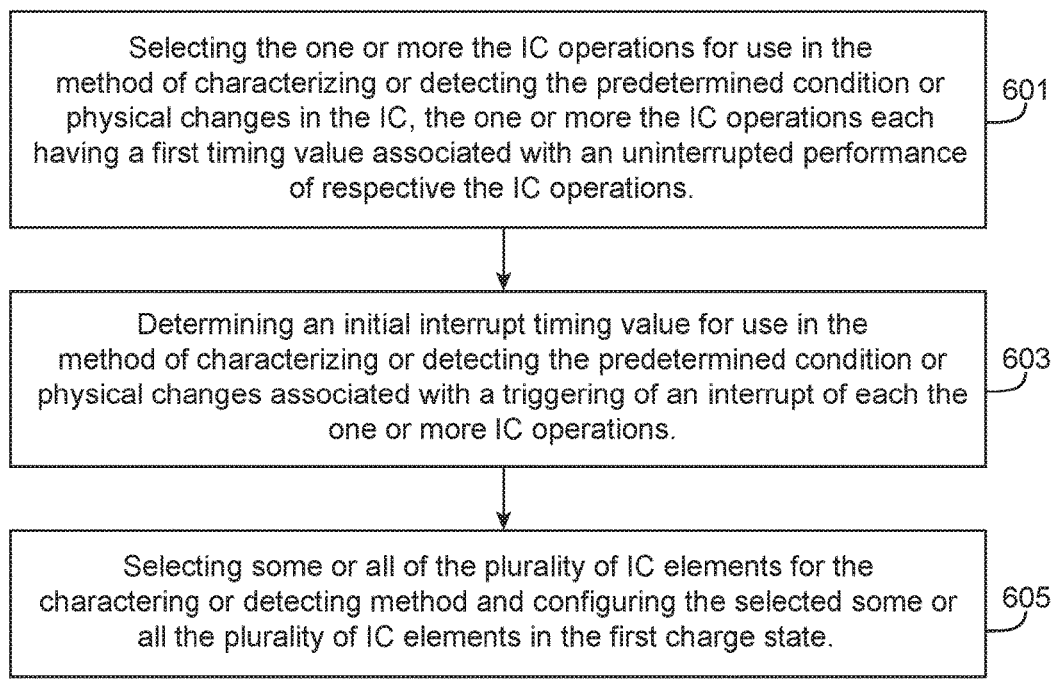
FIG. 18 shows an exemplary plurality of configuration steps referred to in FIG. 17.

Referring to FIG. 18, an exemplary plurality of configuration steps referred to in FIG. 17 can comprise: at step 601, selecting the one or more the IC operations for use in the method of characterizing or detecting the predetermined condition or physical changes in the IC, the one or more the IC operations each having a first timing value associated with an uninterrupted performance of respective the IC operations. At step 603, determining an initial interrupt timing value for use in the method of characterizing or detecting the predetermined condition or physical changes associated with a triggering of an interrupt of each the one or more IC operations. At step 605, selecting some or all of the plurality of IC elements for the charactering or detecting method and configuring the selected some or all the plurality of IC elements in the first charge state.

Figure 19:
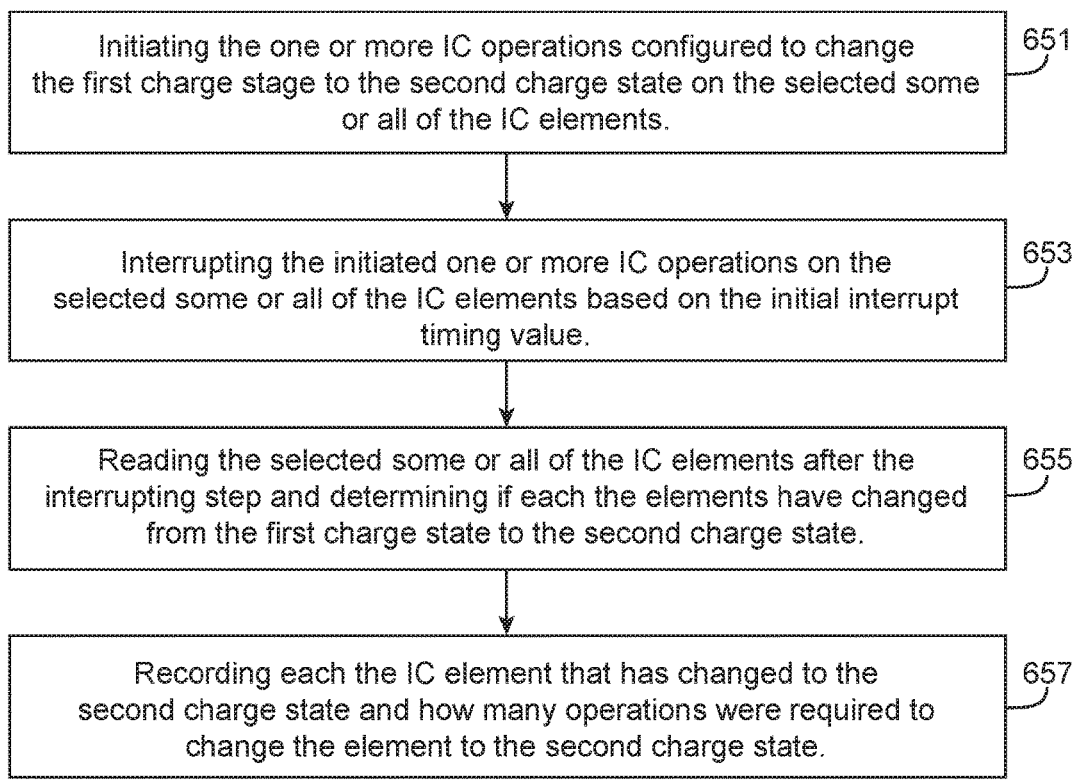
FIG. 19 shows an exemplary first plurality of interrupt processing steps such as performed, e.g., with relation to FIGS. 17-18.

Referring to FIG. 19, an exemplary first plurality of interrupt processing steps such as performed, e.g., with relation to FIGS. 17-18, comprises: At step 651, initiating the one or more IC operations configured to change the first charge stage to the second charge state on the selected some or all of the IC elements. At step 653, interrupting the initiated one or more IC operations on the selected some or all of the IC elements based on the initial interrupt timing value. At step 655, reading the selected some or all of the IC elements after the interrupting step and determining if each the elements have changed from the first charge state to the second charge state. At step 657, recording each the IC element that has changed to the second charge state and how many operations were required to change the element to the second charge state.

With respect to the above discussion in relation to FIGS. 17-19, the predetermined condition or physical changes may comprise program/erase stress, total ionizing dose, and heavy ion radiation. In some exemplary embodiments, the predetermined condition or physical changes can comprise conditions or changes that modify the IC element charge state transitions. IC operations in at least some embodiments can comprise operations configured to execute a series of PROGRAM or ERASE operations. Various embodiments may have the initial interrupt timing value on all of the plurality of selected some or all IC elements is duration that is less than a first time period required for one of the IC operations to complete. The ICs can include embodiments including ones that operate on memory cells of NAND Flash memories or floating gate transistors.

Although the invention has been described in detail with reference to certain preferred embodiments, variations and modifications exist within the spirit and scope of the invention as described and defined in the following claims.

The invention claimed is:

1. A method of characterizing or detecting a predetermined condition or physical changes in an integrated circuit (IC) comprising:
   providing a first device under test (DUT);
   providing a second device under test (DUT), wherein the first and second DUT both comprise an identical IC structure with a plurality of IC elements configured to perform one or more IC operations on or using the IC elements, wherein the first DUT is a known-good state DUT and the second DUT is an unknown state DUT;
   executing a plurality of configuration steps for the first DUT;
   executing a first plurality of interrupt processing steps on the first DUT to determine a first number of interrupted the operations required to cause at least some of the first DUT IC elements to change from a first charge state to a second charge;
   executing a second plurality of interrupt processing steps on the first DUT for a predetermined number of iterations to determine a final the first number of interrupted the operations for the first DUT;
   repeating the first plurality of interrupt processing steps on the second DUT to determine second number of interrupted the operations required to cause at least some of the first DUT IC elements to change from the first charge state to the second charge state;
   repeating the second plurality of interrupt processing steps on the second DUT for the predetermined number of iterations to determine a final the second number of interrupted the operations for the second DUT;
   determining if the predetermined condition or the physical changes have occurred in the IC based on comparing the final first and second numbers of interrupted the operations, wherein if the final second number of interrupted the operations is greater than the final first number of interrupted the operations then the predetermined condition or physical changes has occurred;
   wherein the plurality of configuration steps comprises:
      selecting the one or more the IC operations for use in the method of characterizing or detecting the predetermined condition or physical changes in the IC, the one or more the IC operations each having a first timing value associated with an uninterrupted performance of respective the IC operations;

determining an initial interrupt timing value for use in the method of characterizing or detecting the predetermined condition or physical changes associated with a triggering of an interrupt of each the one or more IC operations;

selecting some or all of the plurality of IC elements for the charactering or detecting method and configuring the selected some or all the plurality of IC elements in the first charge state;

wherein the first plurality of interrupt processing steps comprises:

initiating the one or more IC operations configured to change the first charge stage to the second charge state on the selected some or all of the IC elements;

interrupting the initiated one or more IC operations on the selected some or all of the IC elements based on the initial interrupt timing value;

reading the selected some or all of the IC elements after the interrupting step and determining if each the elements have changed from the first charge state to the second charge state;

recording each the IC element that has changed to the second charge state and how many operations were required to change the element to the second charge state;

wherein the second plurality of interrupt processing steps comprises repeating the first plurality of interrupt processing steps for a predetermined number of iterations.

2. A method as in claim 1, wherein the predetermined condition or physical changes comprises program/erase stress, total ionizing dose, and heavy ion radiation.

3. A method as in claim 1, wherein the predetermined condition or physical changes comprises conditions or changes that modify the IC element charge state transitions.

4. A method as in claim 1, wherein the IC operations comprises operations configured to execute a series of PROGRAM or ERASE operations.

5. A method as in claim 1, wherein the initial interrupt timing value on all of the plurality of selected some or all IC elements is duration that is less than a first time period required for one of the IC operations to complete.

6. A method as in claim 5, wherein the IC operations comprises a PROGRAM or ERASE operation.

7. A method as in claim 1, wherein the ICs comprise memory cells of NAND Flash memories or floating gate transistors.

* * * * *